(12) United States Patent
Wu et al.

(10) Patent No.: US 6,653,885 B2
(45) Date of Patent: Nov. 25, 2003

(54) ON-CHIP INTEGRATED MIXER WITH BALUN CIRCUIT AND METHOD OF MAKING THE SAME

(75) Inventors: John C. Wu, San Diego, CA (US); Paul L. Rodgers, Gardena, CA (US); Jeff T. Mohr, Escondido, CA (US); David E. Kelly, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 10/001,250

(22) Filed: Oct. 30, 2001

(65) Prior Publication Data

US 2002/0163375 A1 Nov. 7, 2002

Related U.S. Application Data

(60) Provisional application No. 60/288,602, filed on May 3, 2001.

(51) Int. Cl.[7] .................................................. G06F 7/44
(52) U.S. Cl. ........................ 327/356; 327/359; 327/355; 327/566; 455/326
(58) Field of Search ................................ 327/355, 356, 327/357, 359, 116, 119–122, 564, 565, 566; 455/311, 326, 333; 257/486, 506, 508, 510, 524

(56) References Cited

U.S. PATENT DOCUMENTS

| | | | |
|---|---|---|---|
| 5,060,298 A | * | 10/1991 | Waugh et al. ............... 455/326 |
| 5,416,043 A | | 5/1995 | Burgener et al. ............. 437/63 |
| 5,428,840 A | * | 6/1995 | Sadhir ......................... 455/326 |
| 5,492,857 A | | 2/1996 | Reedy et al. ................. 437/63 |
| 5,572,040 A | | 11/1996 | Reedy et al. ................. 257/9 |
| 5,596,205 A | | 1/1997 | Reedy et al. ................. 257/9 |
| 5,600,169 A | | 2/1997 | Burgener et al. ........... 257/352 |
| 5,663,570 A | | 9/1997 | Reedy et al. ................. 257/9 |
| 5,752,181 A | * | 5/1998 | Vice .......................... 455/326 |
| 5,861,336 A | | 1/1999 | Reedy et al. ............... 438/407 |
| 5,863,823 A | | 1/1999 | Burgener .................... 438/295 |
| 5,883,396 A | | 3/1999 | Reedy et al. ................. 257/9 |

(List continued on next page.)

OTHER PUBLICATIONS

Miron, *The LC Immittnce Inverter,* RF Design, Jan. 2000, pp. 20–26.

W.G. Kuhn, *Analysis of Current Crowding Effects in Multiturn Spiral Inductors,* IEEE Trans. Microwave Theory and Techniques, vol. 49, pp. 31–38, Jan. 2001.

Lee, The Design of CMOS Radio–Frequency Integrated Circuits, Cambridge University Press (1998) pp. 308–343.

*Primary Examiner*—Timothy P. Callahan
*Assistant Examiner*—Hai L. Nguyen
(74) *Attorney, Agent, or Firm*—Morrison & Foerster LLP

(57) ABSTRACT

A radio frequency (RF) mixing device wherein RF core circuit elements requiring signal splitting are provided with one or more signal splitting element(s) ("balun(s)") integrated on-chip with the core RF circuit elements. The RF mixing device comprises one or more RF circuit element(s) integrated on a common substrate with one or more balun(s), wherein the common substrate is an insulating substrate further provided with associated silicon-based CMOS circuitry formed in a thin, highly crystalline silicon layer formed on the insulating substrate. The insulating substrate is selected from transparent crystalline materials such as sapphire, spinel, etc. The common substrate is preferably ultrathin silicon-on-sapphire.

12 Claims, 10 Drawing Sheets

U.S. PATENT DOCUMENTS

| | | | |
|---|---|---|---|
| 5,895,957 A | 4/1999 | Reedy et al. | 257/352 |
| 5,920,233 A | 7/1999 | Denny | 331/14 |
| 5,930,638 A | 7/1999 | Reedy et al. | 438/382 |
| 5,973,363 A | 10/1999 | Staab et al. | 257/347 |
| 5,973,382 A | 10/1999 | Burgener et al. | 257/532 |
| 6,054,889 A * | 4/2000 | Kobayashi | 327/357 |
| 6,057,555 A | 5/2000 | Reedy et al. | 257/9 |
| 6,057,714 A * | 5/2000 | Andrys et al. | 327/105 |
| 6,125,272 A * | 9/2000 | Bautista et al. | 455/326 |
| 6,184,739 B1 * | 2/2001 | Doyle | 327/359 |
| 6,211,718 B1 * | 4/2001 | Souetinov | 327/359 |
| 6,317,590 B1 * | 11/2001 | Nash et al. | 455/331 |
| 6,351,632 B1 * | 2/2002 | Yan et al. | 455/333 |
| 6,404,317 B1 * | 6/2002 | Mizoguchi et al. | 336/200 |

* cited by examiner

CONVERSION LOSS Vs. FREQUENCY

INPUT IP3 Vs. FREQUENCY

ON-CHIP INTEGRATED MIXER WITH BALUN CIRCUIT AND METHOD OF MAKING THE SAME

RELATED APPLICATIONS

The present application claims priority to U.S. Provisional Application No. 60/288,602, entitled "RF Devices and Method of Making the Same," filed May 3, 2001, which is hereby incorporated by reference.

FIELD OF THE INVENTION

The invention relates generally to radio frequency (RF) communication devices and more specifically to an RF mixer circuit having signal splitting and phase shifting circuitry ("balun"), wherein the balun is integrated on-chip with the core RF mixer circuit. The invention further relates to methods for making RF mixers integrated on-chip with one or more baluns.

BACKGROUND OF THE INVENTION

Integration of RF Functions

Wireless communication via radio frequency (RF) wave transmission presents numerous technical challenges. Contemporary wireless products typically divide RF functions among several integrated circuits and discrete devices, and separate functions may be manufactured in different technologies. Large scale integration (LSI) is a desirable goal in virtually all electronic manufacturing processes but has proven difficult for RF applications, and consequently modular or hybridized approaches are typically used to manufacture products to accomplish complex functions such as frequency translation or "mixing."

RF components such as mixer modules have generally been made by combining semiconductor technology, such as gallium arsenide transistors or silicon diodes, with passive component networks, all mounted on a common carrier. Such hybrid assemblies add cost and complexity to the manufacturing process by comparison with fully monolithic or integrated solutions, and modular construction of parts such as mixers can result in poorly performing, bulky modules that must be soldered on to an "integrated" system. Combining on a single chip RF functions, passive components (e.g., resistors, capacitors, inductors), and the control functions, usually fabricated in CMOS circuitry on silicon, for example, could enhance product performance, reliability, and manufacturing flow tolerances, while decreasing size, power consumption, and manufacturing costs. However, attempts at high levels of integration which attempt to combine RF functions on a single chip have proven to be difficult, expensive and generally unsatisfactory.

One earlier approach to partially integrating several different functions on a single substrate is the thin-film hybrid process. The combination of several chips on a thin-film hybrid substrate for RF applications requires precise manufacturing practices and circuit elements. Many processing steps are necessary. For instance, these steps generally include depositing a thin layer of metal on a substrate, coating it, and finally removing the metal layer by etching to form a desired pattern. This process is repeated for the deposition of resistive films to create circuit elements. Ultimately, semiconductor devices are attached to the patterned substrate and these individual chips are interconnected by the patterned transmission lines within the hybrid package.

Such thin-film hybrid fabrication processes can be expensive and time consuming and can have significant yield problems that increase proportionally with the number of integrated circuits on the substrate. Furthermore, modular or hybrid construction processes can be economically inefficient due to the testing and retesting of the various subassemblies required to feed into the end product. The further along in the process before defects are discovered, the greater the waste of resources. Thus, yield losses from the incorporation of multiple chips on a hybrid circuit can be very costly.

Another factor which can increase hybrid cost is variation in stray coupling between closely-spaced RF circuits. This phenomenon is traceable to the placement of lumped element components. The mechanical alignment precision of these components on the hybrid substrate is inherently poor, their sizes and shapes are numerous and varied, and the placement equipment typically has loose registration tolerance for placement accuracy. Stray RF coupling between active components, passive components, and interconnect wiring can be a significant factor in reducing manufacturing yields. These stray coupling variations can make it difficult to achieve repeatable circuit performance, thereby resulting in serious yield problems.

For the above reasons, attempts to integrate systems more completely with monolithic microwave integrated circuits (MMICs) have increased. Many of these efforts have been frustrated, however, by the limited availability of high performance substrates. A number of significant problems arise from using substrates that are not highly insulating. High electrical loss, high inter-element parasitic capacitance, high conductor-to-substrate capacitances, and other deleterious effects can result from using substrates such as gallium arsenide (GaAs) and bulk silicon that are not highly insulating.

Substrates such as gallium arsenide (GaAs) and bulk silicon can have serious disadvantages for the integration of both active and passive RF components in a single chip. For silicon, for example, the performance of passive components can be severely impaired by the conductivity of the substrate. Insertion loss along transmission lines and isolation between non-connected devices are both poor owing to this conductivity. For GaAs, for example, the ability to integrate large numbers of active devices can be limited by a relatively high defect density of the substrate. Both technologies have their individual merits, but they cannot be merged readily into a single system except through modular methods.

Differential Signal Processing

Differential signal processing enhances performance in an RF system. Integrated circuit manufacturing naturally promotes differential design techniques because of the small size, low cost, and superior matching of devices available. For cost reasons, signal routing in the hybrid or module realm tends to be single ended rather than differential. RF signals tend to be routed through expensive cabling and precision machined RF connectors. Naturally, single ended routing cuts costs in half and is very desirable to endpoint manufacturers of RF equipment. Routing single ended signals into and out of differential circuits, on the other hand, introduces problems that must be overcome.

One known type of device for combining differential signals into a single ended output signal is referred to in the art as a "balun" (balanced input/unbalanced output). A balun is often used when it is desired to couple a balanced system or device to an unbalanced system or device, or vice versa. A typical example is the coupling of a two-line (balanced)

circuit, such as a cellular telephone transmitting circuit, to a single-line (unbalanced) circuit, such as an antenna. Another example is the use of a balun as a signal splitter/phase shifter used with a balanced mixer, wherein a single ended input signal is split into complementary signals that are 180 degrees out of phase with one another.

Conventional baluns are tightly coupled structures fabricated much like a conventional transformer that uses discrete components, e.g. typically comprising transformer-coupled windings on a ferrite core. When implemented as discrete components in modular design approaches, these baluns require a relatively large amount of board space.

In applications that are sensitive to size and accuracy, e.g., wireless mobile telephones, a balun must meet the criteria of compactness, minimum insertion loss and power wastage, and precise 0–180° phase separation. Although prior art baluns are known which accomplish one or two of these objectives, there are no economical solutions which satisfactorily accomplish all three. Using discrete lumped element components, instead of transformers, to generate the complementary 0–180° signals from a single ended source is an effective method, but it requires that the inductor and capacitor elements used in the networks match one another with high accuracy. This design approach argues strongly in favor of an integrated circuit solution wherein element matching can easily be better than 1%.

Frequency Conversion

A mixer is a critical component of radio-frequency (RF) systems. It is usually the first or second device after the RF input, so the mixer is crucial to the operation of the system. Various mixer parameters, such as bandwidth, interport isolation, conversion efficiency, and linearity, must be optimized for each given application. The mixer translates an RF signal at one frequency into a signal at a different, usually lower, frequency, in order to make signal propagation easier and less expensive. Changing the frequency of a signal without altering its information content is necessary because signal processing components, such as amplifiers, are much less expensive and work better when they are designed to operate at lower frequencies.

A radio receiver mixer is generally a three port non-linear device that takes an incoming low level radio frequency (RF) signal and multiplies or mixes it with a strong signal from a local oscillator (LO) to produce signal frequencies including the sum, difference (IF) and cross-products of the RF and LO signals. Mixers, therefore, are employed in devices where it is desirable to convert a higher frequency signal to a lower frequency signal including any receiver systems such as wireless communications base stations and so forth. Mixers are also employed in devices requiring upconverting a low frequency signal to a higher frequency signal.

Mixing an input signal with a local oscillator (LO) signal yields upper and lower sidebands around the LO frequency. Each sideband has the same information content as the input signal. The upper sideband is the sum of the input and LO frequencies, while the lower sideband is the difference between the input and LO frequencies. Usually, it is the lower sideband (the "downconverted" signal) which is used in receiving systems, whereas the upper sideband (the "upconverted" signal) is typically used in transmission systems. The upper or lower sideband, whichever is chosen, is called the intermediate frequency (IF) signal.

There are basically four types of mixers: single-ended, singly balanced, doubly balanced, and doubly—doubly balanced (also called triply-balanced). However, all types are three-port devices, and comprise an input port (the RF port), a local oscillator input port (the LO port), and an output port (the IF port). The LO, RF and IF ports combine through filters to provide some degree of inter-port isolation. Single-ended mixers generally have a narrow bandwidth, limited dynamic range, and poor inter-port isolation.

Better isolation and broader bandwidth can be obtained with a singly-balanced mixer. The mixer is fed by the LO signal through a balun which provides differential (180 degrees out of phase) signals to the mixer. Doubly balanced mixers feed the RF signal through a second balun, providing interport isolation both between the LO and RF ports and between the LO and IF ports. Doubly balanced mixers typically use twice the number of diodes or transistors (four) as a singly-balanced mixer, and the diodes or transistors are often, although not always, arranged in a "quad" ring configuration. A doubly—doubly balanced mixer ordinarily employs twice the number of diodes or transistors (eight) as a doubly balanced mixer and is often, though not always, realized by combining two quad ring mixers. The number of circuit nodes and conductors rises commensurately, and doubly—doubly balanced mixers thus engender complex circuit topographies.

The balanced mixers may additionally employ a balun to convert the differential IF output signals into a single ended IF output signal, depending on the requirements of the application.

Active mixers employ a current source and perform the mixing function in terms of currents. By contrast, passive mixers switch voltages. Considering that silicon CMOS technology offers excellent switches, high performance passive mixers are preferably realized in CMOS form. Passive mixers are compact and have the potential for extremely low power operation, making them well-suited for wireless communications applications, e.g. in mobile phones. Generally, the trade off that they provide—high linearity and low noise in exchange for lower gain and less bandwidth—is acceptable in such end-uses.

On-Chip Integration

The challenge presented RF components made in silicon CMOS technology is on-chip integration with other passive components such as inductors and capacitors. This challenge is substantial for RF mixers which require differential signal processing circuitry having capacitors and relatively sizable inductors that render the circuits susceptible to deleterious substrate coupling effects when formed on substrates that are not highly insulating. Examples of such substrates include GaAs, silicon, and even silicon-on-insulator (SOI) substrates, where a silicon substrate is isolated from the device Si layer by an intervening oxide layer.

To summarize, there exists a need to fabricate RF mixers that require differential signal processing in an on-chip integrated form that consumes low amounts of power and that provides high performance as measured by low noise and high linearity. It would be advantageous to form RF mixers that are wholly isolated, to avoid parasitics and losses due to substrate coupling. It would be further advantageous to reduce the cost, size, and manufacturing complexities of RF mixers by replacing discrete components with on-chip integrated circuit elements wherever possible. Significant system performance improvements could be realized if RF mixers, their required balun circuits, and any associated silicon-based CMOS control circuitry could be integrated on the same chip to produce a high-yield, high-performance RF mixer device.

SUMMARY OF THE INVENTION

It is therefore an object of the invention to provide an RF mixer device having one or more signal splitting/phase shifting element(s) ("balun(s)") integrated on-chip with the core RF mixer circuit elements. It is a further object of the invention to provide methods for making an RF mixer device comprising one or more baluns integrated on-chip with the core RF mixer circuit elements.

In one embodiment, the invention provides an RF mixer device including a plurality of transistors formed on a highly insulating substrate and at least one balun integrated on-chip with the transistors.

In a further embodiment, an RF mixer device includes silicon-based CMOS circuitry integrated on a common substrate with one or more balun(s), wherein the common substrate includes a thin, highly crystalline silicon layer formed on the highly insulating substrate. In preferred embodiments, the highly insulating substrate is selected from transparent crystalline materials such as sapphire, spinel, etc.

In another embodiment, an RF mixer includes one or more RF circuit element(s) integrated on a common substrate with one or more balun(s), wherein the common substrate comprises an ultrathin silicon-on-sapphire (UTSi) substrate.

In another embodiment, the invention provides methods for fabricating an RF mixer including RF circuit elements integrated on-chip with one or more baluns on a common substrate, wherein the common substrate for integration comprises ultrathin silicon-on-sapphire. By the method of the invention, mixers along with associated balun circuitry may be fabricated in ultrathin silicon on sapphire, characterized by extremely high linearity and low loss.

In yet another embodiment, the invention provides a method for forming an RF mixer having at least one RF circuit element formed in a thin layer of silicon on a sapphire substrate, wherein at least one port of the RF circuit element is connected to a balun integrated on-chip with the RF circuit element. In a further embodiment, the RF circuit element includes MOS transistors.

In a further embodiment, the invention provides a method to fabricate a high linearity passive mixer comprising MOS transistors formed on an ultrathin silicon-on-sapphire substrate, wherein the mixers typically exhibit conversion loss of less than about 7 dB and an input IP3 of greater than about 30 dBm.

DETAILED DESCRIPTION AND PREFERRED EMBODIMENTS

Figure 1:
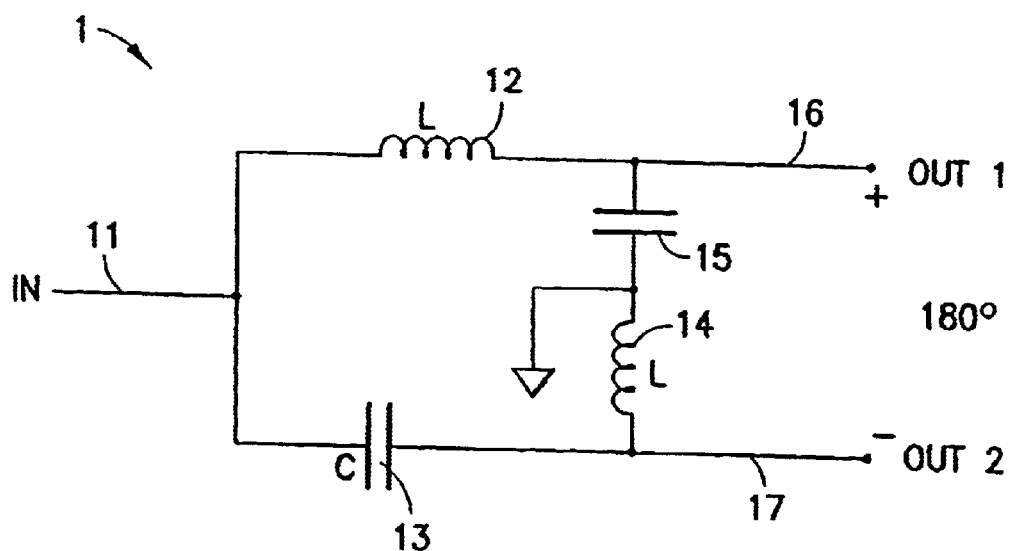
FIG. 1 illustrates an electrical schematic diagram of a balun.

The invention is described in detail below with reference to the figures. The figures are generally illustrative and are not necessarily shown to scale, or in exact proportion.

The invention provides an RF mixer plus associated balun circuitry integrated in a common silicon-on-insulator substrate. In a preferred embodiment, the common substrate is a UTSi substrate. The advantages of using a composite silicon-on-insulator substrate comprising a monocrystalline semiconductor layer, such as silicon, epitaxially deposited on a supporting insulating substrate, such as sapphire, have been well-recognized. These advantages include the substantial reduction of parasitic capacitance between charged active regions and the substrate and the effective elimination of leakage currents flowing between adjacent active devices. This is accomplished by employing as the substrate an insulating material, such as sapphire ($Al_2O_3$), spinel, or other known highly insulating materials, and providing that the conduction path of any interdevice leakage current must pass through the substrate.

Integration of silicon circuits and RF elements on a common insulating substrate requires effective methods for forming the silicon devices as well as the RF elements on the insulating substrate. It has been found that high quality silicon films suitable for demanding device applications can be fabricated on insulating substrates by a method that involves epitaxial deposition of a silicon layer on an insulating substrate, low temperature ion implantation to form a buried amorphous region in the silicon layer, and annealing the composite at temperatures below about 950° C. Examples of silicon-on-insulator devices and methods for making such devices are described in U.S. Pat. Nos. 5,416,043 ("Minimum charge FET fabricated on an ultrathin silicon on sapphire wafer"); 5,492,857 ("High-frequency wireless communication system on a single ultrathin silicon on sapphire chip"); 5,572,040 ("High-frequency wireless communication system on a single ultrathin silicon on sapphire chip"); 5,596,205 ("High-frequency wireless communication system on a single ultrathin silicon on sapphire chip"); 5,600,169 ("Minimum charge FET fabricated on an ultrathin silicon on sapphire wafer"); 5,663,570 ("High-frequency wireless communication system on a single ultrathin silicon on sapphire chip"); 5,861,336 ("High-frequency wireless communication system on a single ultrathin silicon on sapphire chip"); 5,863,823 ("Self-aligned edge control in silicon on insulator"); 5,883,396 ("High-frequency wireless communication system on a single ultrathin silicon on sapphire chip"); 5,895,957 ("Minimum charge FET fabricated on an ultrathin silicon on sapphire wafer"); 5,920,233 ("Phase locked loop including a sampling circuit for reducing spurious side bands"); 5,930,638 ("Method of making a low parasitic resistor on ultrathin silicon on insulator"); 5,973,363 ("CMOS circuitry with shortened P-channel length on ultrathin silicon on insulator"); 5,973,382 ("Capacitor on ultrathin semiconductor on insulator"); and 6,057,555 ("High-frequency wireless communication system on a single ultrathin silicon on sapphire chip").

As used herein, the following terms are defined as follows:

"Ultrathin silicon-on-sapphire" or "UTSi" refers to a silicon layer formed on a sapphire substrate wherein the silicon layer is less than approximately 270 nm thick and has an areal density of electrically active states in regions not intentionally doped which is less than approximately $5 \times 10^{11}$ cm$^{-2}$. In a preferred embodiment, such a silicon layer formed on a sapphire substrate can be achieved by epitaxially depositing a layer of silicon on a surface of a sapphire substrate; implanting a given ion species into the layer of silicon under such conditions that the implanted ions form a buried amorphous region in the silicon layer which extends substantially from the surface of the sapphire substrate into the layer of silicon, thus leaving a surface layer of monocrystalline silicon covering the buried amorphous region; selecting an areal portion of the silicon layer and maintaining the areal portion during formation of the buried amorphous region at or below a predetermined temperature which is substantially uniform throughout the areal portion of the silicon layer during the ion implanting step; annealing the wafer to induce solid phase epitaxial regrowth of the buried amorphous region using the surface layer of monocrystalline silicon as a crystallization seed; performing any processing of the layer of silicon which subjects the layer of silicon to temperatures in excess of approximately 950 degrees Celsius in an oxidizing ambient environment; and performing any processing of the silicon layer which subjects the layer of silicon to temperatures which are less than approximately 950 degrees Celsius in either one of an oxidizing ambient environment or a non-oxidizing ambient environment.

Methods of making composite substrates, comprising high quality thin films of silicon on single crystal sapphire, are known in the art and described in previously referenced U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. By the methods described in these patents, electronic devices can be formed in an extremely thin layer of silicon on an insulating synthetic sapphire wafer. The thickness of the silicon layer is typically less than 150 nm. This "ultrathin" silicon layer maximizes the advantages of the insulating sapphire substrate and allows the integration of multiple functions on a single chip. Traditional transistor isolation wells required for thick silicon are unnecessary, simplifying transistor processing and increasing circuit density.

"CMOS devices" refers to Complementary Metal Oxide Semiconductor devices such as MOSFETs which are fabricated in silicon. Silicon-based CMOS technology is capable of achieving an extremely high density of devices in consistently high yields. In a preferred embodiment of the invention, the method largely employs standard CMOS processing technology that is well known for bulk silicon CMOS devices. Utilizing the processes described in the U.S. patents cited above, MOS transistors may be formed on a UTSi substrate using standard CMOS technology.

Figure 1A:
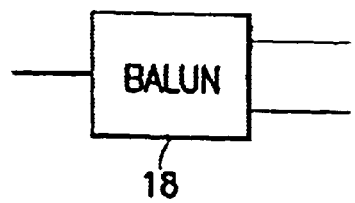

An example of a useful balun for RF applications is disclosed in Miron, "The LC Immittance Inverter," RF Design, January 2000, pp. 20–26 (hereinafter "the Miron reference"). FIG. 1 illustrates a circuit schematic diagram of a typical balun circuit consisting of LC high pass and low pass filters. As known in the art, these filters have + or −90 degree phase shift characteristics. When such high pass and low pass filters are connected together, a 180 degree phase shift results. By properly choosing the inductances of inductors 12 and 14 and the capacitances of capacitors 13 and 15, it is possible to convert input signal 11 to obtain differential signals 16 and 17, which are phase shifted 180 degrees apart from one another at the desired frequency and impedance. For convenience, balun 1 of FIG. 1 is depicted as block 18 of FIG. 1A in the remaining figures and discussion below.

The procedures for selecting L and C values are known to a practitioner, e.g., the equations disclosed in the Miron reference may be employed:

$L = X_L/w$ where $X_L = Z_0 Z_{LOAD}$ = inductive reactance (Equation 1)

$C = 1/(X_C w)$ where $X_C$ = capacitive reactance (Equation 2)

$w = 2\pi f$ (Equation 3)

The magnitude of $X_C$ is the same as the magnitude of $X_L$; $Z_0$ is the source impedance and $Z_{LOAD}$ is the output impedance.

Figure 2:
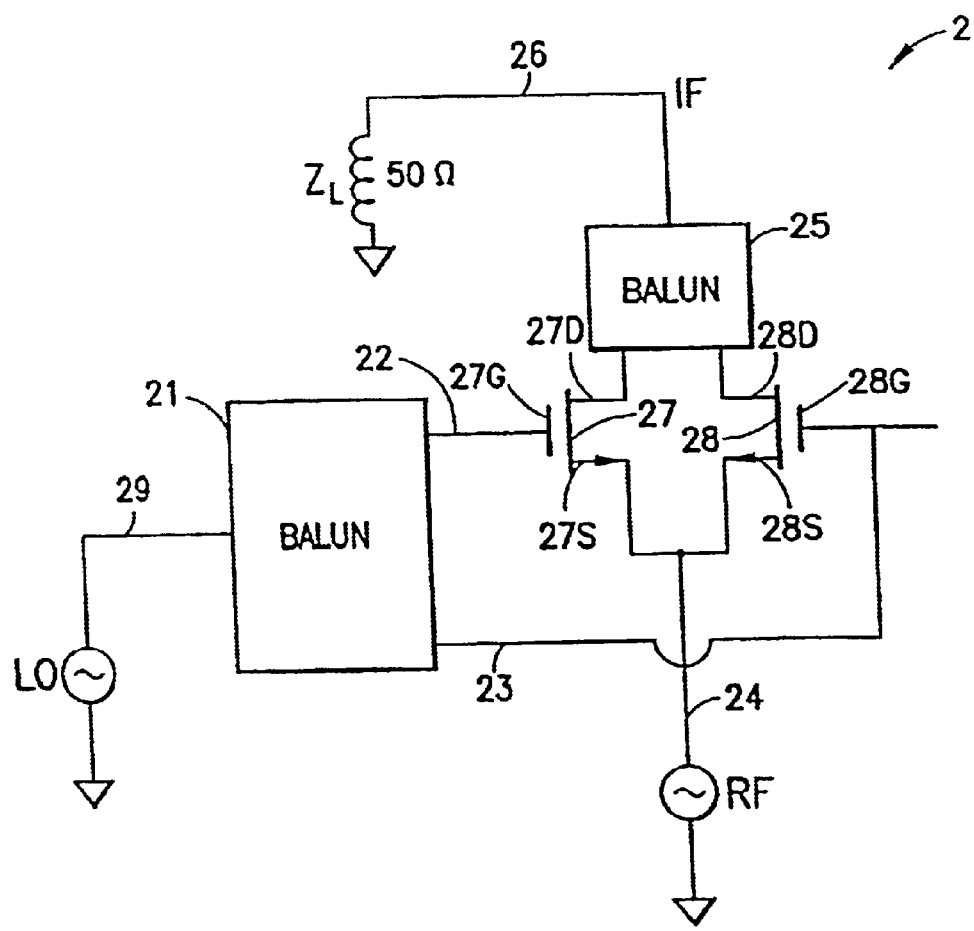
FIG. 2 illustrates an electrical schematic diagram of a singly balanced mixer with balun integrated on-chip.

FIG. 2 is a schematic layout of a system 2 comprising a singly balanced mixer with at least one balun integrated on-chip, in accordance with one embodiment of the invention. The core of the mixer consists of two NMOS transistors 27 and 28. The RF input is fed through 24, a point where transistor sources 27S and 28S are shorted. Single ended LO signal at 29 enters the balun 21. The resulting differential outputs 22 and 23 are fed into transistor gates 27G and 28G respectively. The large signal swings of the differential outputs 22 and 23 switch transistor gates 27G and 28G on and off. The RF signal 24 to the transistor sources is "chopped" by the on/off switching of gates 27G and 28G. The transistor drains 27D and 28D are connected via balun 25 to provide a differential output signal at the IF port 26. The IF signal is the sum and difference of the RF and LO frequencies according to the equations:

$$\text{Sin } V_{RF} \text{ Cos } V_{LO} = A_1 \text{ Sin } (V_{RF} - V_{LO}) + A_2 \text{ Sin } (V_{RF} + V_{LO})$$

Where $V_{RF}$ = the RF frequency, $V_{LO}$ = the LO frequency and $A_1$ and $A_2$ are constants.

Thus, the RF and LO signals are mixed to generate output IF signals at the IF output terminal 26.

Figure 3:
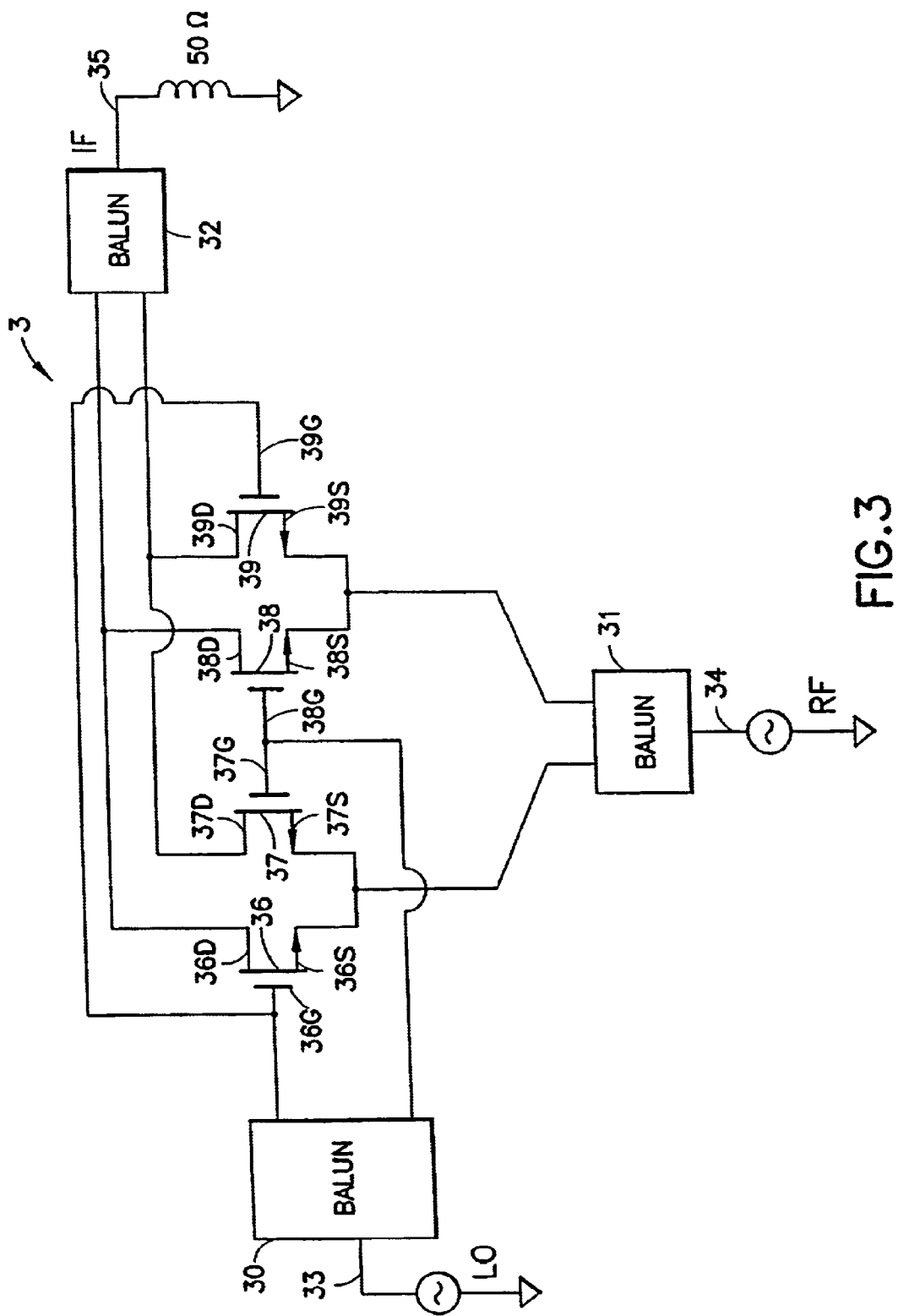
FIG. 3 illustrates an electrical schematic diagram of a doubly balanced mixer with balun integrated on-chip.

A simplified circuit schematic diagram of another exemplary system 3 comprising a doubly balanced RF mixer with at least one balun integrated on-chip is illustrated in FIG. 3, in accordance with one embodiment of the invention. This mixer provides high performance with low cost and small size. The mixer comprises a network of four interconnected MOS transistors 36, 37, 38, and 39. In this system 3, a local oscillator (LO) port 33 provides a low frequency signal to a first balun 30. The first balun 30 in turn provides a first low frequency signal to the pairs of transistor gates 37G and 38G and a second low frequency signal, which is 180 degrees out of phase with the first low frequency signal, to transistor gates 36G and 39G. These signals, when applied to the gates, turn the respective transistors on and off. Thus, the first and second low frequency signals act upon transistor pairs 37/38 and 36/39 as a commutating switch. As further shown in FIG. 3, an RF signal is received at RF port 34 and connected via a second balun 31 to transistor sources 36S and 37S and 38S and 39S. The signal received at sources 36S and 37S is 180 degrees out of phase with the signal received at sources 38S and 39S. The RF signal to the sources is "chopped" by the on/off switching of the gates, which is controlled by the LO signal. The drains of all four transistors are combined pairwise, i.e., 36D+38D, 37D+39D, to provide a fully differential output signal at the IF port 35. The IF signal is the sum and difference of the RF and LO frequencies according to the equation given above. The signals are mixed to generate output IF signals via a third balun 32 at the IF output terminal 35.

Figure 4:
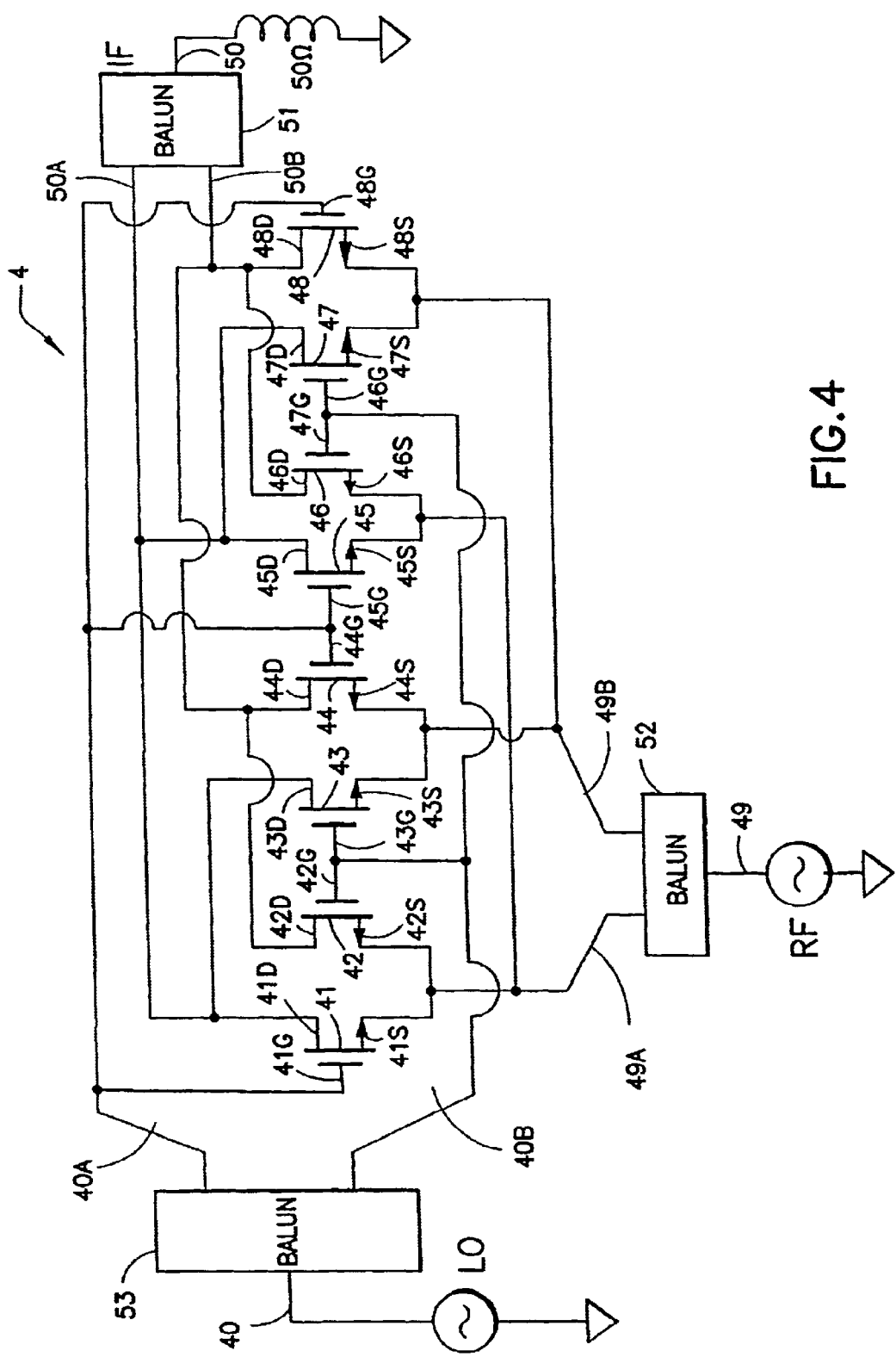
FIG. 4 illustrates an electrical schematic diagram of a doubly—doubly balanced mixer with balun integrated on-chip.

FIG. 4 illustrates a circuit schematic diagram of a system 4 comprising a doubly—doubly balanced mixer with at least one balun integrated on-chip, in accordance with one embodiment of the invention. Its operation is similar to the doubly balanced mixer described in FIG. 3, but system 4 has higher power-handling capability as described below. An RF signal is provided at RF port 49. Balun 52 converts the single ended signal into differential signals 49A and 49B. From 49A, an RF signal enters the doubly—doubly balanced transistors 41, 42, 45 and 46 at sources 41S, 42S, 45S and 46S. From 49B, the complementary 180 degree out of phase signal enters the transistors 43, 44, 47 and 48 at transistor sources 43S, 44S, 47S and 48S. From LO port 40, single ended LO signal enters balun 53, where it is converted into 180 degree out of phase signals 40A and 40B. From 40A, one part of the differential signal enters transistor gates 41G, 44G, 45G and 48G. The respective complementary 180 degree out of phase signal enters transistor gates 42G, 43G, 46G, and 47G. The outputs from transistor drains 41D, 43D, 45D and 47D are collected at 50A. The outputs from transistor drains 42D, 44D, 46D, and 48D are collected at 50B. The IF balun 51 collects the resulting IF differential signals 50A and 50B and combines all into a single ended signal 50.

System 4 of FIG. 4 is better suited for higher-power operations when compared to system 3 of FIG. 3. The MOS transistor array that makes up the mixer core consumes much less space than the passive components. Hence, if higher power handling capability is desired, there is a motivation to use the more complex circuit design of FIG. 4 since the additional space consumed by the additional transistors is relatively small and the additional manufacturing complexity generally is not significant.

Figure 5:
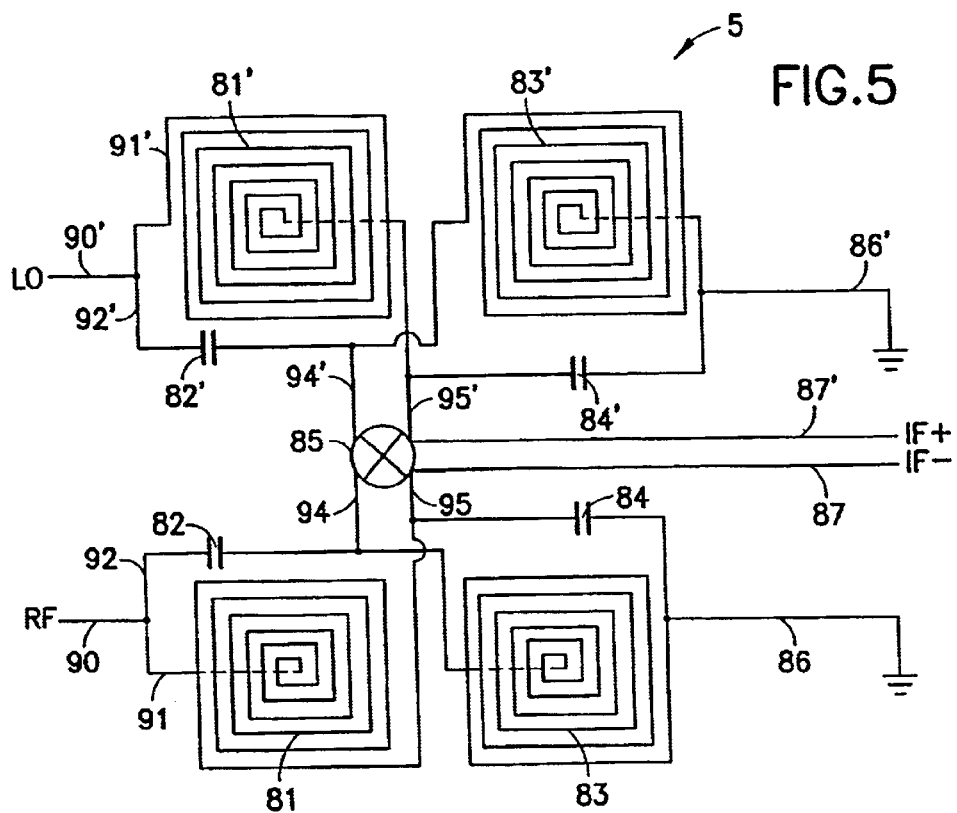
FIG. 5 illustrates a schematic layout design for forming a doubly balanced mixer integrated on-chip with its RF and LO input baluns.
Figure 5A:
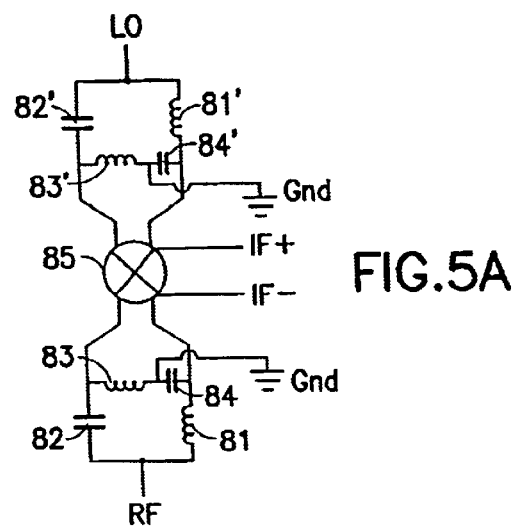

FIG. 5 illustrates a simplified layout design for a system 5 comprising a doubly balanced mixer 85 integrated on-chip with its RF and LO input baluns, in accordance with one embodiment of the invention. Inset FIG. 5A illustrates a circuit schematic diagram of the system of FIG. 5. System 5 includes a doubly balanced mixer 85 that may be any doubly balanced type of mixer such as, for example, the mixers shown in FIG. 3 or FIG. 4. The single ended signal from the RF port 90 is fed into a first balun which comprises inductors 81 and 83 and capacitors 82 and 84 and is provided with ground connection 86. Likewise, the single ended signal from the LO port 90' is fed into a second balun which is made up of inductors 81' and 83' and capacitors 82' and 84' and is provided with ground connection 86'. Each balun operates as described above with reference to FIG. 1 to provide a differential signal to the mixer 85. The mixer output, differential signals IF$^+$ and IF$^-$, may be recombined via another integrated balun (not shown) to yield a single ended IF signal, if desired. Although FIG. 5 represents a simplified design, it illustrates the "real estate" issue presented by on-chip integration of sizable components such as inductors.

As discussed above, the integration of RF mixer components such as CMOS transistors with other passive components such as inductors and capacitors in a single chip that consumes low amounts of power and provides high performance, as measured by low noise and high linearity, has heretofore posed significant challenges. In designing such a chip, it is desirable to achieve device compactness, minimum insertion loss and power wastage, and precise 0–180 degree phase separation, as well as overall device linearity and noise figure. By implementing the methods disclosed herein, an RF mixer and balun(s) integrated in a single chip is provided that typically exhibits a conversion loss of less than 7 dB and a third order nonlinearity parameter input IP3 of greater than 30 dBm.

As illustrated in FIG. 5, one of the primary obstacles to integrating a mixer and balun circuitry in a single chip is the "real estate" issue posed by the inductors of the balun. Additionally, when using traditional substrates such as silicon, the quality factor of on-chip integrated inductors is limited by energy dissipation in the substrate. Losses manifest themselves as high series resistance, due to magnetically coupled eddy currents and electrically coupled displacement currents in the substrate, and low self-resonant frequency fsR, due to the capacitance between the metal traces and the conductive substrate.

Figure 6:
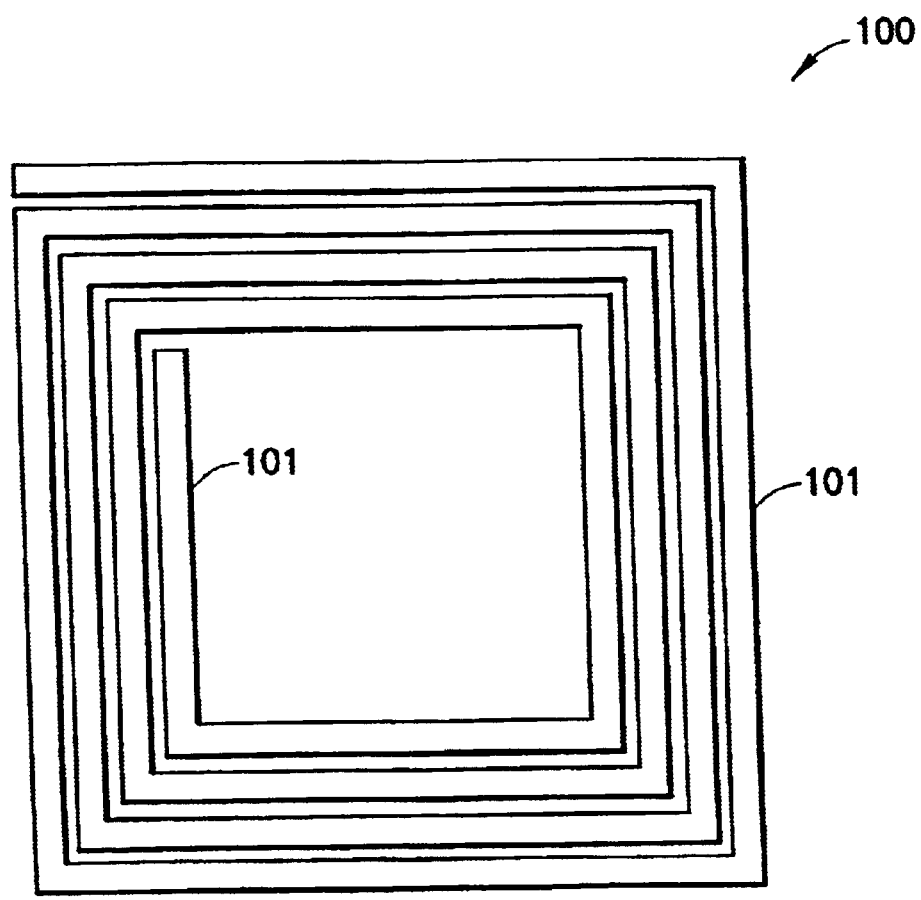
FIG. 6 illustrates a current density plot for an inductor with proximity effect current crowding.

For inductors on an insulating substrate, e.g., silicon on insulator (SOI) such as UTSi, the second order effects (e.g., "skin effect" and "proximity effect") on quality factor in a silicon substrate technology are the primary loss mechanisms. The quality factor is limited by current constriction due to skin effect, and more importantly, the proximity effect of adjacent turns. As is known in the art, the skin effect occurs due to attenuating of time-varying signals in a conductor. As the frequency of a signal (e.g., an electromagnetic wave) guided by a conductor increases, the effective cross-sectional area of the conductor is reduced as time-varying fields attenuate quickly within the conductor. The result is higher current density at the outer boundaries (i.e., "skin") of the conductor and no current at the center of the conductor. While the skin effect increases resistance with the square-root of frequency, the proximity to adjacent turns in a spiral inductor causes resistance to increase with the square of frequency—a far more pronounced effect. The cause of this is the superposition of magnetic fields from all of the turns in the inductor creating eddy currents in each turn which crowds the desired current to one edge of the conductor. At the center of the spiral inductor, current is crowded at the inside edge of the metal lines. Conversely, at the outer edge of the inductor, the current is confined to the outside edge of the metal. FIG. 6 illustrates a current density profile for an inductor 100 with significant proximity effect current crowding, where the dark regions 101 at the edges of the inductor metal lines (i.e., windings) illustrate the regions of current crowding.

To combat this problem, the magnetic flux density in the inductor must be reduced. The inductor can either be physically larger in exchange for added cost and "real estate," or the spacing between the turns can be increased at the expense of the turn width so that the total B-field normal to the conductors is lower. Prior work has shown that increasing the spacing between turns extends the frequency range before the resistance takes on a square-law increase. See, W. G. Kuhn and N. M. Ibrahim, *Analysis of Current Crowding Effects in Multiturn Spiral Inductors*, IEEE Trans. Microwave Theory and Techniques, vol. 49, pp. 31–38, Jan. 2001.

Figure 7:
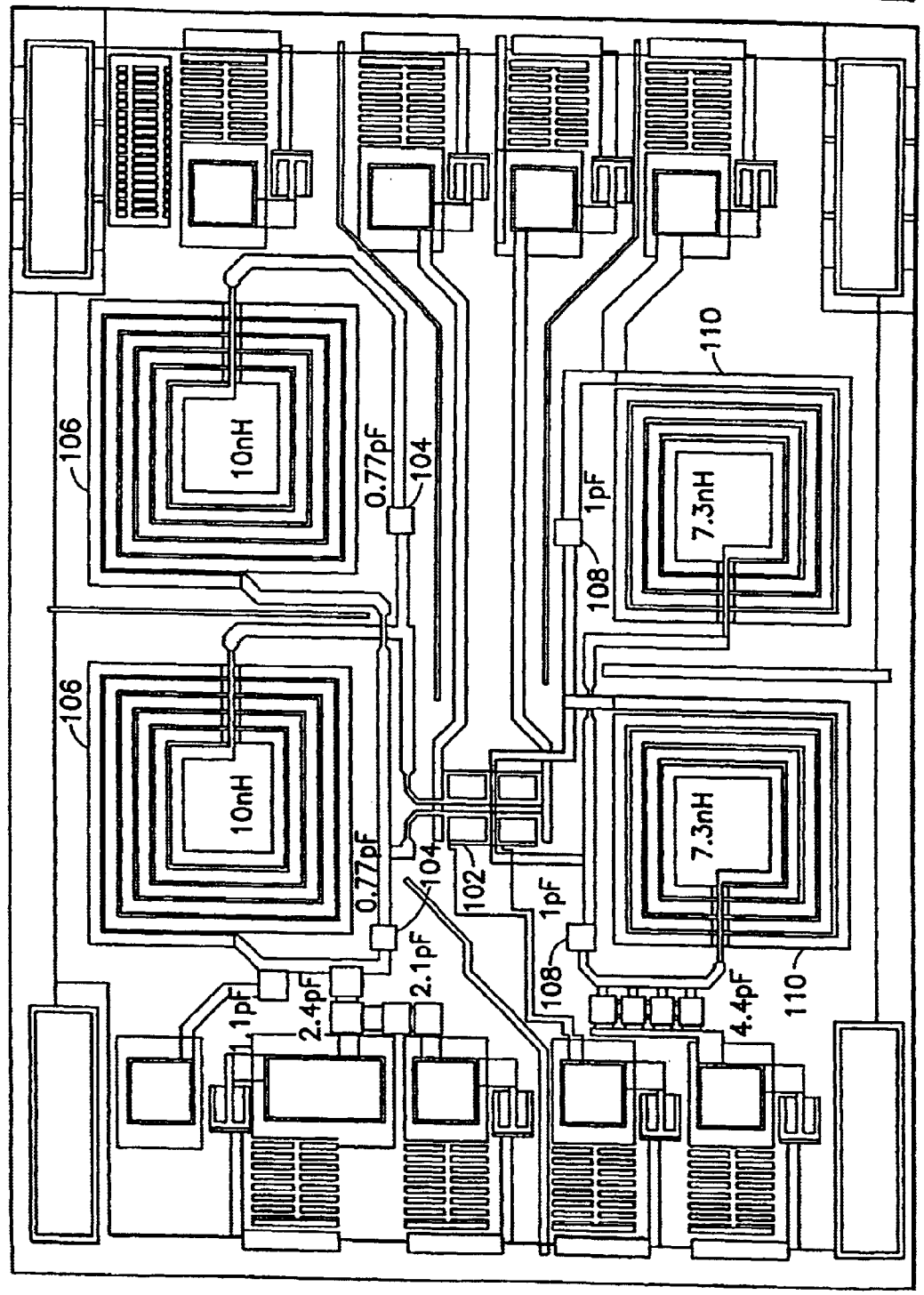
FIG. 7 illustrates a design layout diagram of an on-chip integrated mixer and balun circuitry, in accordance with one embodiment of the invention.

A design layout diagram of a preferred embodiment of an on-chip integrated mixer and balun circuitry is shown in FIG. 7 in accordance with one embodiment of the invention. As illustrated in FIG. 7, the device utilizes mixer core circuitry having four MOSFET transistors 102 designed to operate as passive devices. In a preferred embodiment, when designed to operate at a bandwidth of 1800 to 2000 MHz, each transistor has a gate width (NL) of 250 microns. In this frequency range, a first balun includes a first set of capacitors 104 having a capacitance of approximately 0.77 pF and a first set of inductors 106 having an inductance of approximately 10.0 nH. A second balun includes a second set of capacitors 108 having a capacitance of approximately 1.0 pF and a second set of inductors 110 having an inductance of approximately 7.3 nH.

In a preferred embodiment, the capacitors are fabricated using "metal insulator metal" (MIM) technology. This type of capacitor typically does not have a very high capacitance per unit area, but it has a high quality factor due to low loss in metals.

Getting the right inductance is only half of the battle. It is also desirable for the inductors to have a low series resistance, or high quality factor. As is known in the art, high series resistance results in high conversion loss which is commercially undesirable. In order to achieve low series resistance inductors, a new metal process is implemented that provides an extra thick metal layer. In a preferred embodiment, the inductors are fabricated in a UTSi substrate and made by stacking three layers of metal which are shorted together to form a stacked metal trace. The metal layers are separated by intermetal dielectric layers and the metal layers are shorted to one another through via holes in the intermetal dielectric layers. This technique lowers the series resistance of the inductors and, hence, increases the quality factor of the inductors.

Figure 8:
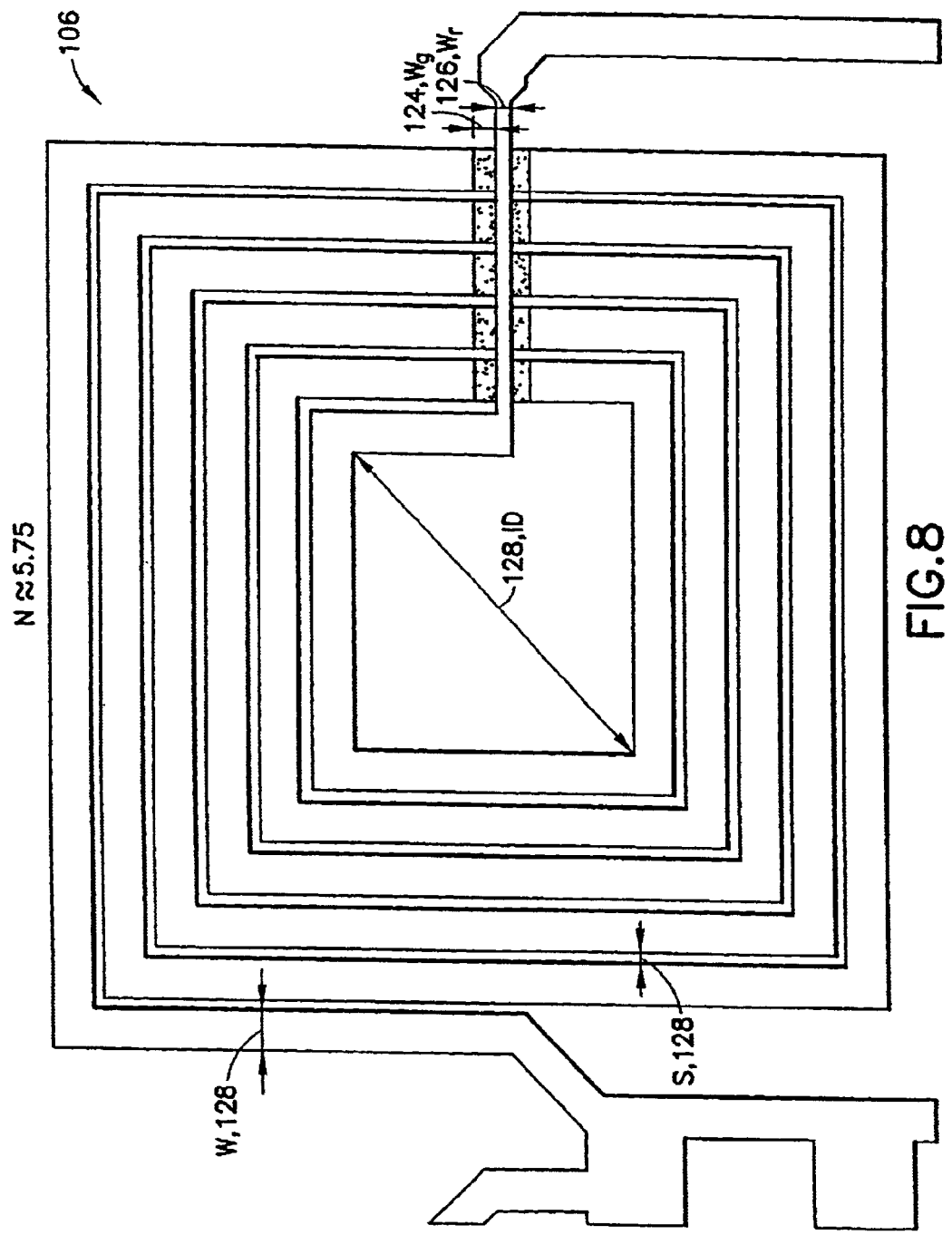
FIG. 8 illustrates a close-up layout view of an inductor shown in FIG. 7.

For example, in one embodiment, for a device designed to operate between 1800–2000 MHz, the top metal layer of the inductor 106 (FIG. 7) is approximately 1–6 microns, the middle layer is approximately 0.6–1 micron, and the bottom metal layer is approximately 0.6–1 micron. FIG. 8 illustrates further details of inductor 106 in accordance with a preferred embodiment of the invention. In a preferred embodiment, referring to FIG. 8, the inductor 106 comprises approximately 5.75 turns (N); the width (w) 120 of each line trace is approximately 22 microns, the spacing (s) 122 between each line trace is approximately 4 microns; the gap between a return line and a regular line trace (wg) 124 is approximately 10 microns; the return line width (wr) 126 is approximately 8.4 microns; and the inner diagonal or diameter of the inductor (ID) 128 is approximately 145 microns. Similarly, the inductor 110 (FIG. 7) comprises approximately 4.75 turns with physical dimensions substantially similar to those mentioned above for inductor 106.

Of course, inductance and capacitance values, and other design parameters, may vary depending on the desired operating frequency range and other design specifications. For example, if a mixer plus balun circuit operating at around 1 GHz is desired, in a preferred embodiment, the four MOSFET transistors 102 of FIG. 7 each have a transistor gate width (NL) of 500 microns. In one embodiment, when designed to operate at a frequency of approximately 1 GHz, the first balun includes a first set of capacitors 104 having a capacitance of approximately 0.6 pF and a first set of inductors 106 having an inductance of approximately 10.9 nH. The second balun includes a second set of capacitors 108 having a capacitance of approximately 1.1 pF and a second set of inductors 110 having an inductance of approximately 6.3 nH. Aside from the number of turns, in one embodiment, the other physical dimensions (e.g., w, s, wg, wr, ID) are similar to those described above for the 2 GHz device.

As a further example, for 6 GHz operation, in a preferred embodiment, the four MOSFET transistors 102 of FIG. 7 each have a transistor gate width (NL) of 125 microns. In one embodiment, at an operating frequency centered around 5.7–6 GHz, the first balun includes a first set of capacitors 104 having a capacitance of approximately 0.2 pF and a first set of inductors 106 having an inductance of approximately 4.6 nH. The second balun includes a second set of capacitors 108 having a capacitance of approximately 0.286 pF and a second set of inductors 110 having an inductance of approximately 2.74 nH. Again, aside from the number of turns, in one embodiment, the other physical dimensions (e.g., w, s, wg, wr, ID) are similar to those described above for the 2 GHz device.

Proper impedance matching between the balun and any external circuit connected to the balun is also necessary to achieve desired performance requirements. As is well known in the art, various methods and parameters such as voltage standing wave ratios (VSWR), reflection coefficients, or return loss (log magnitude representation of the reflection coefficient) may be used to measure impedance matching characteristics. In a preferred embodiment, in the case of the LO balun 30 (FIG. 3), impedance matching is achieved so as to provide less than 10 dB return loss, and preferably less than 20 dB return loss. The impedance of the balun is typically designed to match $Z_{LOAD}$, the impedance of a load, in accordance with Equation 3 above. Thus, the LO balun 30 should match the gate-to-ground impedance of the four NMOS transistors, to whose gates it is connected. However, the gate impedance of those transistors switches hard and rapidly. Recall that the pairs of transistors in the mixer function like a commutating switch. Thus, the impedance switches between $Z_{gate(on)}$ and $Z_{gate(off)}$. By modeling the circuit design using known circuit modeling software such as Cadence Spectre® RF or Agilent Advanced Design System, it was discovered that the device worked optimally when the load impedance $Z_{LOAD}$ was set to $Z_{gate(on)}$, the transistor gate impedance when the transistor is in an ON state and operating in a passive mode (i.e., no dc current biasing).

In a preferred embodiment, the mixer and balun circuitry are fabricated in an ultrathin silicon on sapphire (UTSi) substrate on a single IC chip. By implementing the design methods and properly matching the balun impedances as described above, the invention provides a single chip RF device comprising a mixer plus balun(s) capable of achieving an input IP3 of more than 30 dBm with less than 7 dB of conversion loss.

The quality of integrated RF devices is typically measured in terms of low conversion loss and high linearity. A switching mixer operates by a form of sampling. The conversion loss of the sampling process is proportional to the ratio of mixer resistance vs. total circuit resistance. Included in this analysis is the resistance of the balun and the impedance matching networks. The high quality factor ("high Q") elements have very low resistance when made in the silicon-on-sapphire process, leading to very low conversion losses in the finished products. Furthermore, the combined load of shunt conductances in a bulk silicon CMOS process robs signal energy from the forward transmission path, whereas silicon-on-sapphire employs a pure insulator as the substrate and suffers no conducting substrate ill effects. The combination of high Q factor passives and the loss-less insulating substrate lead to very low conversion loss mixers, e.g., <7 dB conversion loss.

Figure 9:
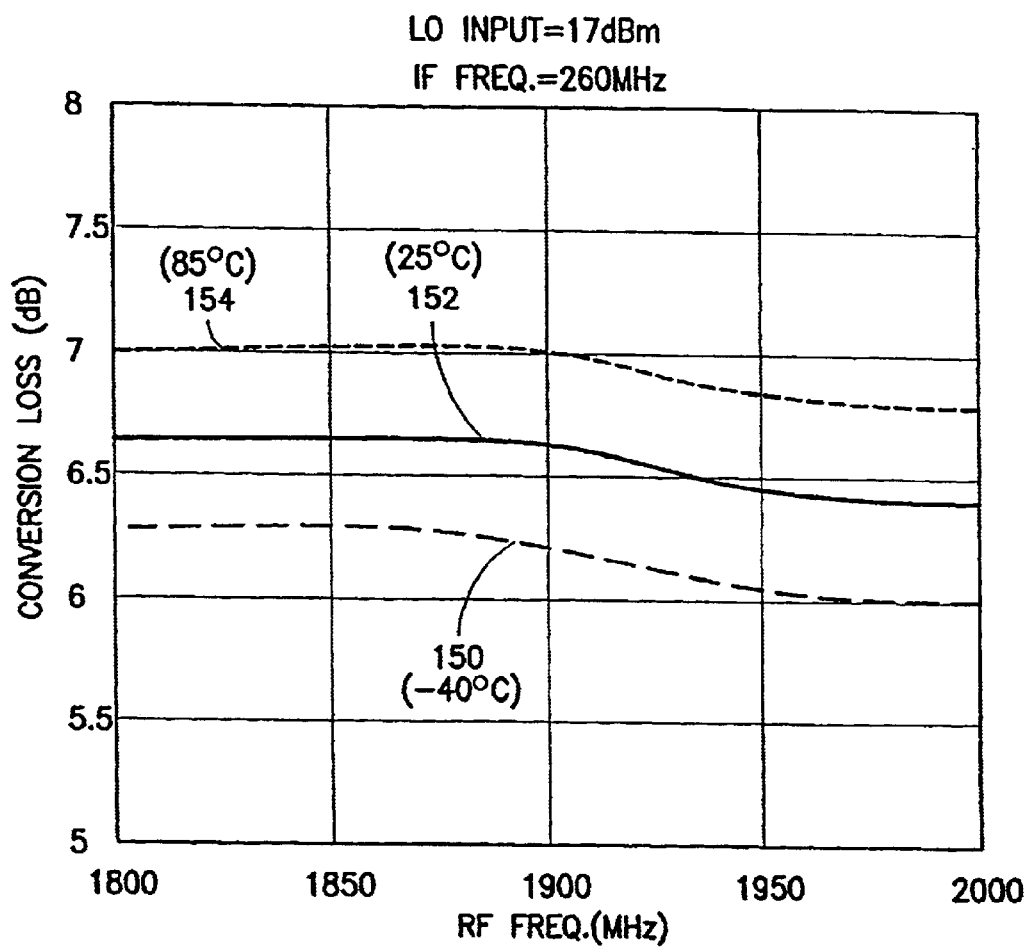
FIG. 9 illustrates graph plots of conversion loss vs. frequency at various temperatures of a device made in accordance with one embodiment of the invention.

FIG. 9 illustrates graph plots 150, 152 and 154 of measured conversion loss as a function of frequency for three operating temperatures (−40° C., 25° C. and 85° C., respectively) for an RF mixer plus balun device made in accordance with the methods described herein. As shown in FIG. 9, for all operating temperatures, in a frequency range between 1800 and 2000 MHz, conversion losses were approximately at or below 7 dB.

MOS transistors in a typical bulk silicon CMOS process have numerous sources of nonlinearity due to the bulk interface. Ordinarily, the bulk interface is a necessary mechanism in CMOS to provide dielectric isolation between transistors. Parasitic diodes exist between the transistor channel and the bulk potential which limit the RF linearity of large signal RF devices such as mixers. Other bulk CMOS problems include capacitors whose capacitance varies non-linearly with applied voltage and a parasitic bulk/source current generator that all contribute to intermodulation products in bulk CMOS. Silicon on sapphire has no bulk interface and consequently exhibits superior large signal linearity.

Figure 10:
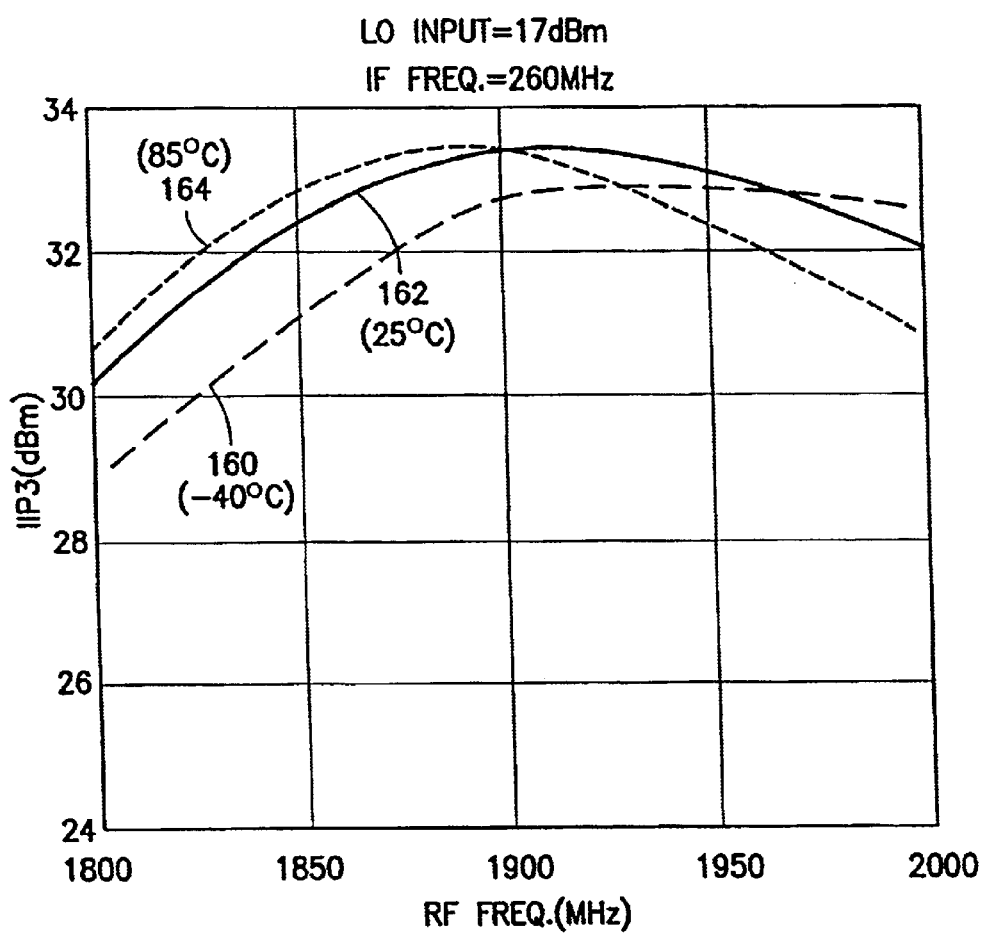
FIG. 10 illustrates graph plots of input IP3 vs. frequency at various temperatures of a device made in accordance with one embodiment of the invention.

Third order intercept "IP3" is a standard measure of linearity derived from the extrapolated intersection of the curves plotted for desired output and third order intermodulation output vs. input RF level (see Lee, T. H. *The Design of CMOS Radio-Frequency Circuits*, Cambridge Univ. Press, Cambridge, 1998, Chapter 12: "Mixers" for details). Passive mixers formed in thin layers of silicon on sapphire, with on-chip integrated baluns, according to FIGS. 3 and 4, were fabricated and tested. FIG. 10 illustrates graph plots 160, 162 and 164 of input IP3 values as functions of frequency for three operating temperatures (−40° C., 25° C. and 85° C., respectively). As shown in FIG. 10, input IP3 values greater than approximately 33 dBm were obtained.

Thus, the present invention provides a method for integrating one or more RF core circuit element(s) with one or more input balun(s) on a single chip. Preferably, the substrate is an ultrathin silicon-on-sapphire substrate. The invention has been described in detail for an RF mixer integrated on-chip with at least one input balun on an ultrathin silicon-on-sapphire substrate.

In another aspect, an embodiment of the present invention provides mixers comprising silicon MOS transistors formed on a silicon-on-sapphire substrate, preferably an ultrathin silicon-on-sapphire substrate, characterized by low conversion loss (<about 7 dB) and high linearity (input IP3>about 30 dBm). As MOS devices, the mixers consume low amounts of power and are capable of on-chip integration with a great variety of standard high speed CMOS circuitry. The sapphire substrate provides excellent isolation and enables the formation of high quality factor passive components such as those required to form baluns. Hence the mixers are capable of on-chip integration with baluns to provide differential signal management without the need for unwieldy off chip components.

Various other modifications of this invention will occur to those skilled in the art. All deviations from the specific teachings of this specification that basically rely on the principles and their equivalents through which the art has been advanced are properly considered within the scope of the invention as described and claimed.

What is claimed is:

1. A single chip RF mixing device, comprising:
   first and second MOS transistors, wherein said first and second MOS transistors operate as unbiased transistors;
   a first balun circuit comprising a first input port for receiving a local oscillator (LO) signal, a first output port for providing a first signal to a gate of said first MOS transistor and a second output port for providing a second signal to a gate of said second MOS transistor, said first balun circuit further comprising a first plurality of inductors and a first plurality of capacitors, wherein said first balun circuit is an unbiased balun; and
   an RF input port for providing an RF input signal to sources of said first and second MOS transistors;
   wherein said first and second MOS transistors, said first plurality of inductors, and said first plurality of capacitors are integrated in a silicon-on-insulator substrate within a single chip so as to provide a single chip RF mixing device having a conversion loss of less than approximately 7 dB.

2. The device of claim 1, wherein said first plurality of inductors each comprise at least three metal layers separated by intermetal dielectric layers, wherein said at least three metal layers are shorted to one another by means of via holes through said intermetal dielectric layers.

3. The device of claim 2 wherein a thickness of a top metal layer of said at least three metal layers is approximately 1–6 microns thick, a thickness of a middle layer of said at least three metal layers is approximately 0.6–1 microns thick and a thickness of a bottom layer of said at least three metal layers is approximately 0.6–1 micron thick.

4. The device of claim 3 wherein the impedance of said first plurality of inductors matches a respective impedance of said gates of said first and second MOS transistors when they are in an ON state and operating in a passive mode so as to provide less than 10 dB return loss.

5. The device of claim 1 wherein said silicon-on-insulator substrate is an ultra-thin silicon on sapphire (UTSi) substrate.

6. The device of claim 5 further characterized by a third order non-linearity parameter input IP3 of greater than approximately 30 dBm.

7. The device of claim 1 further comprising:
   third and fourth MOS transistors, wherein said third and fourth MOS transistors operate as unbiased transistors;
   a second balun circuit comprising a second plurality of inductors, a second plurality of capacitors, a second input port for receiving said RF input signal, a third output port for providing a third signal to said sources of said first and second MOS transistors, and a fourth output port for providing a fourth signal to sources of said third and fourth MOS transistors, wherein said second balun circuit is an unbiased balun;
   wherein said first output port of said first balun circuit further provides said first signal to a gate of said fourth MOS transistor and said second output port of said first balun circuit further provides said second signal to a gate of said third MOS transistor; and
   wherein said first, second, third and fourth MOS transistors, said first and second plurality of inductors, and said first and second plurality of capacitors are integrated in a silicon-on-insulator substrate within a single chip so as to provide a single chip RF mixing device having a conversion loss of less than approximately 7 dB.

8. The device of claim 7, wherein said first and second plurality of inductors each comprise at least three metal layers separated by intermetal dielectric layers, wherein said at least three metal layers are electrically connected to one another by means of via holes through said intermetal dielectric layers.

9. The device of claim 7 where said first plurality of inductors are designed to match a respective impedance of said gates of said first and second MOS transistors when they are in an ON state and operating in a passive mode so as to provide less than 20 dB return loss.

10. The device of claim 7 wherein said silicon-on-insulator substrate is an ultra-thin silicon on sapphire (UTSi) substrate.

11. The device of claim 7 further characterized by a third order non-linearity parameter input IP3 of greater than 30 dBM.

12. A single chip RF mixing device, comprising:

first, second, third and fourth unbiased MOS transistors;

a first unbiased balun circuit comprising a first plurality of inductors and a first plurality of capacitors, wherein said first balun receives a local oscillator (LO) signal and generates first and second signals that are 180 degrees out of phase from one another, wherein the first signal is provided to gates of said first and fourth MOS transistors and the second signal is provided to gates of said second and third MOS transistors;

a second unbiased balun circuit comprising a second plurality of inductors and a second plurality of capacitors, wherein said second balun receives an RF input signal and generates third and fourth signals that are 180 degrees out of phase from one another, wherein the third signal is provided to sources of said first and second MOS transistors, and the fourth signal is provided to sources of said third and fourth MOS transistors; and wherein said first, second, third and fourth MOS transistors, said first and second plurality of inductors, and said first and second plurality of capacitors are integrated in a silicon-on-insulator substrate within a single chip so as to provide a single chip RF mixing device having a conversion loss of less than approximately 7 dB.

* * * * *